United States Patent
Rao et al.

(10) Patent No.: US 10,474,385 B2
(45) Date of Patent: Nov. 12, 2019

(54) MANAGING MEMORY FRAGMENTATION IN HARDWARE-ASSISTED DATA COMPRESSION

(71) Applicant: GOOGLE INC., Mountain View, CA (US)

(72) Inventors: Santhosh Rao, San Francisco, CA (US); Sameer Nanda, San Jose, CA (US); Vyacheslav Vladimirovich Malyugin, Los Gatos, CA (US); Luigi Semenzato, Oakland, CA (US); Aaron Durbin, Glen Carbon, IL (US); Keith Robert Pflederer, San Jose, CA (US); Hsiao-Heng Kelin Lee, San Jose, CA (US); Rahul Jagdish Thakur, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 219 days.

(21) Appl. No.: 15/394,621

(22) Filed: Dec. 29, 2016

(65) Prior Publication Data
US 2017/0242614 A1   Aug. 24, 2017

Related U.S. Application Data

(60) Provisional application No. 62/298,836, filed on Feb. 23, 2016.

(51) Int. Cl.
*G06F 12/02* (2006.01)
*G06F 3/06* (2006.01)

(52) U.S. Cl.
CPC .......... *G06F 3/0638* (2013.01); *G06F 3/0608* (2013.01); *G06F 3/0656* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 5,729,668 A | 3/1998 | Claflin et al. | |
| 5,761,536 A | 6/1998 | Franaszek et al. | |
| 2011/0080956 A1* | 4/2011 | Zhou | H04N 19/61 375/240.24 |

FOREIGN PATENT DOCUMENTS

| | | |
|---|---|---|
| GB | 2305274 | 4/1997 |
| TW | 201243580 | 11/2012 |

(Continued)

OTHER PUBLICATIONS

"Written Opinion", PCT Application No. PCT/US2017/016799, dated Aug. 31, 2017, 9 pages.

(Continued)

*Primary Examiner* — Charles Rones
*Assistant Examiner* — Ryan Dare
(74) *Attorney, Agent, or Firm* — Colby Nipper PLLC

(57) ABSTRACT

Systems, devices, and methods for managing fragmentation in hardware-assisted compression of data in physical computer memory which may result in reduced internal fragmentation. An example computer-implemented method comprises: providing, by a memory management program to compression hardware, a compression command including an address in physical computer memory of data to be compressed and a list of at least two available buffers for storing compressed data; using, by the compression hardware, the address included in the compression command to retrieve uncompressed data; compressing the uncompressed data; and selecting, by the compression hardware, from the list of at least two available buffers, at least two buffers for storing compressed data based on an amount of space that would remain if the compressed data were stored in the at (Continued)

least two buffers, wherein each of the at least two selected buffers differs in size from at least one other of the selected buffers.

20 Claims, 11 Drawing Sheets

(56) References Cited

FOREIGN PATENT DOCUMENTS

| TW | 201432456 | 8/2014 |
|----|-----------|--------|
| WO | 2011048400 | 4/2011 |
| WO | 2015179483 | 11/2015 |
| WO | 2017146898 | 8/2017 |

OTHER PUBLICATIONS

Brian Rapp, "IBM Active Memory Expansion (AME)", Nov. 6, 2012, https://www.ibm.com/developerworks/community/wikis/home?lang=en#!/wiki/Power%20Systems/page/IBM%20Active%20Memory%20Expansion%20%28AME/%29.

"Foreign Office Action", Taiwanese Application No. 10610611, dated Jun. 27, 2018, 13 pages.

"International Preliminary Report on Patentability", PCT Application No. PCT/US2017/016799, dated Aug. 28, 2018, 10 pages.

* cited by examiner

MANAGING MEMORY FRAGMENTATION IN HARDWARE-ASSISTED DATA COMPRESSION

CROSS-REFERENCE TO RELATED APPLICATIONS

The present application claims priority to U.S. Provisional Patent Application Ser. No. 62/298,836, filed Feb. 23, 2016, the entire disclosure of which is hereby incorporated by reference.

BACKGROUND

Data compression is an effective way to optimize usage of dynamic random-access memory (DRAM), and it is more energy efficient to use dedicated compression hardware to offload the task of compression than it is to use software (e.g. a memory management program) running on a processor (e.g. the central processing unit (CPU)). The CPU typically does not access all physical computer memory at once, and different pieces of physical computer memory are usually associated with different tasks. The operating system generally will manage this process of compressing the data in physical computer memory, and using dedicated compression hardware to compress the data in physical computer memory will allow this technique to be used more efficiently in terms of both time and energy.

It is difficult to know how much space is required to store compressed data before compressing the data. When compression hardware is used to compress data in physical computer memory, the compression hardware knows the size of the compressed data after compression and therefore can determine where the compressed data should be stored. Fragmentation occurs where the space used to store the compressed data is larger than necessary. Any fragmentation that occurs makes the data compression less effective.

SUMMARY

This Summary introduces a selection of concepts in a simplified form to provide a basic understanding of some aspects of the present disclosure. This Summary is not an extensive overview of the disclosure, and is not intended to identify key or critical elements of the disclosure or to delineate the scope of the disclosure. This Summary merely presents some of the concepts of the disclosure as a prelude to the Detailed Description provided below.

The present disclosure generally relates to methods, devices, and systems for compression of data in physical computer memory. More specifically, aspects of the present disclosure relate to managing fragmentation for hardware-assisted compression of data in physical computer memory.

In at least one embodiment, a computer-implemented method comprises receiving, at compression hardware, a compression command including an address in physical computer memory of data to be compressed and an identification of available buffers for storing compressed data output by the compression hardware, the available buffers having different sizes; retrieving uncompressed data from the physical computer memory using the received address; determining, by the compression hardware, a size of the compressed data; selecting, by the compression hardware, one or more of the available buffers identified in the received compression command in which to store the compressed data; and communicating, by the compression hardware, to a memory management program, information associated with the uncompressed data, the compressed data, and/or the available buffers.

According to other aspects, in at least one embodiment, the computer-implemented method further comprises compressing, by the compression hardware, the uncompressed data retrieved from the physical computer memory into compressed data, wherein the buffer size for storing the compressed data is determined based on a size of the compressed data.

According to other aspects of the computer-implemented method, in at least one embodiment, the compression hardware selects the one or more of the available buffers in which to store the compressed data based on an amount of unused space that will remain in the one or more of the available buffers after the compressed data is stored in the one or more of the available buffers.

According to other aspects of the computer-implemented method, in at least one embodiment, the one or more selected buffers differs in size from at least one other of the available buffers.

According to other aspects of the computer-implemented method, in at least one embodiment, the information associated with the uncompressed data, the compressed data, and/or the available buffers includes at least one of: a size of the compressed data, a status of the compressed data, a status of the uncompressed data, or which of the available buffers were selected for storing the compressed data.

According to other aspects of the computer-implemented method, in at least one embodiment, a status of the compressed data includes at least one of: the data retrieved from the physical computer memory was compressible, the compressed data was stored in the one or more selected buffers, the compressed data was copied to the one or more selected buffers, or the compressed data was not copied to the one or more selected buffers.

According to other aspects of the computer-implemented method, in at least one embodiment, a status of the uncompressed data includes at least one of: the uncompressed data is incompressible, the uncompressed data was copied to a single destination buffer, or the uncompressed data was copied and split between multiple destination buffers.

According to other aspects, in at least one embodiment, the computer-implemented method further comprises, in response to the retrieving the uncompressed data from the physical computer memory using the received address, determining that the uncompressed data is incompressible; and storing the uncompressed data to one or more destination buffers.

According to other aspects of the computer-implemented method, in at least one embodiment, the uncompressed data is determined to be incompressible based on the size of compressed data being greater than a threshold amount.

According to other aspects, in at least one embodiment, the computer-implemented method further comprises selecting, by the compression hardware, at least two of the available buffers identified in the received compression command in which to store the compressed data, wherein each of the selected buffers differs in size from at least one other of the selected buffers.

According to other aspects, in at least one embodiment, the computer-implemented method further comprises selecting, by the compression hardware, at least two of the available buffers based on minimizing an amount of unused space that will remain in the at least two available buffers after the compressed data is stored in the at least two available buffers, wherein each of the at least two available buffers differs in size from at least one other of the at least two available buffers.

According to other aspects, in at least one embodiment, the computer-implemented method further comprises decompressing, by the compression hardware, the selected at least two available buffers in response to a decompression command from the memory management program.

In at least one embodiment, a computer-implemented method for decompressing compressed data stored in at least two buffers in physical computer memory, the computer-implemented method comprises receiving, at compression hardware, a decompression command from a memory management program executed on a processor other than the compression hardware, wherein the decompression command includes an identification of the at least two buffers and a destination address in physical computer memory for storing decompressed data output by the compression hardware, and wherein each of the at least two buffers differs in size from at least one other of the at least two buffers; outputting, by the compression hardware, decompressed data by decompressing the compressed data stored in the at least two buffers; storing the decompressed data output by the compression hardware at the destination address in physical computer memory; and communicating, by the compression hardware, to the memory management program information associated with the decompressed data.

According to other aspects of the computer-implemented method, in at least one embodiment, the communicating, by the compression hardware, to the memory management program information associated with the decompressed data includes at least one of the following: informing of a completed decompression, informing of an error in decompression, updating a decompression status in a register, generating an interrupt, or writing a decompression status to an address in physical computer memory.

In at least one embodiment, a device comprises a processor; physical computer memory; compression hardware in communication with the processor; and a memory management program providing a compression command to the compression hardware, the compression command including an address in the physical computer memory of data to be compressed and a list of a plurality of available buffers for storing compressed data output by the compression hardware, the buffers having different sizes, the compression hardware configured to: use the address included in the compression command to retrieve uncompressed data; compress the uncompressed data into compressed data; and select, from the list of available buffers, at least two buffers for storing compressed data, wherein each of the at least two buffers selected from the list differs in size from at least one other of the buffers not selected from the list.

According to other aspects of the device, in at least one embodiment, the at least two buffers selected from the list are selected based on an amount of unused space that will remain in the at least two buffers selected from the list if the compressed data is stored in the at least two buffers selected from the list.

According to other aspects of the device, in at least one embodiment, the compression hardware is configured to communicate to the memory management program a size of the compressed data, a status of the compressed data, a status of the uncompressed data, and/or which buffers from the list of available buffers were selected for storing compressed data.

According to other aspects of the device, in at least one embodiment, the memory management program provides a decompression command to the compression hardware, the decompression command including: a destination address in physical computer memory for storing decompressed data output by the compression hardware; and a list of at least two data buffers in physical computer memory, wherein compressed data is stored in the at least two data buffers, and wherein each of the at least two data buffers differs in size from at least one other of the at least two data buffers; and wherein the compression hardware is configured to: output decompressed data by decompressing the compressed data stored in the at least two data buffers; store the decompressed data at the destination address in physical computer memory; and communicate to the memory management program information associated with the decompressed data.

According to other aspects of the device, in at least one embodiment, the compression hardware is configured to communicate to the memory management program information of a completed decompression, information of an error in decompression, an update in decompression status, and/or an interrupt responsive to a decompression operation.

According to other aspects of the device, in at least one embodiment, the at least two buffers selected from the list are selected based on minimizing an amount of unused space that will remain in the at least two buffers selected from the list after the compressed data is stored in the at least two buffers selected from the list.

It should be noted that embodiments of some or all the processor and memory systems disclosed herein may also be configured to perform some or all the method embodiments disclosed above. In addition, embodiments of some or all the methods disclosed above may also be represented as instructions embodied on non-transitory computer-readable storage media such as optical or magnetic memory.

Further scope of applicability of the methods, devices, and systems of the present disclosure will become apparent from the Detailed Description given below. However, the Detailed Description and specific examples, while indicating embodiments of the methods, devices, and systems, are given by way of illustration only, since various changes and modifications within the spirit and scope of the concepts disclosed herein will become apparent to those skilled in the art from this Detailed Description.

BRIEF DESCRIPTION OF DRAWINGS

These and other objects, features, and characteristics of the present disclosure will become more apparent to those skilled in the art from a study of the following Detailed Description in conjunction with the appended claims and drawings, all of which form a part of this specification. In the drawings:

Figure 1:
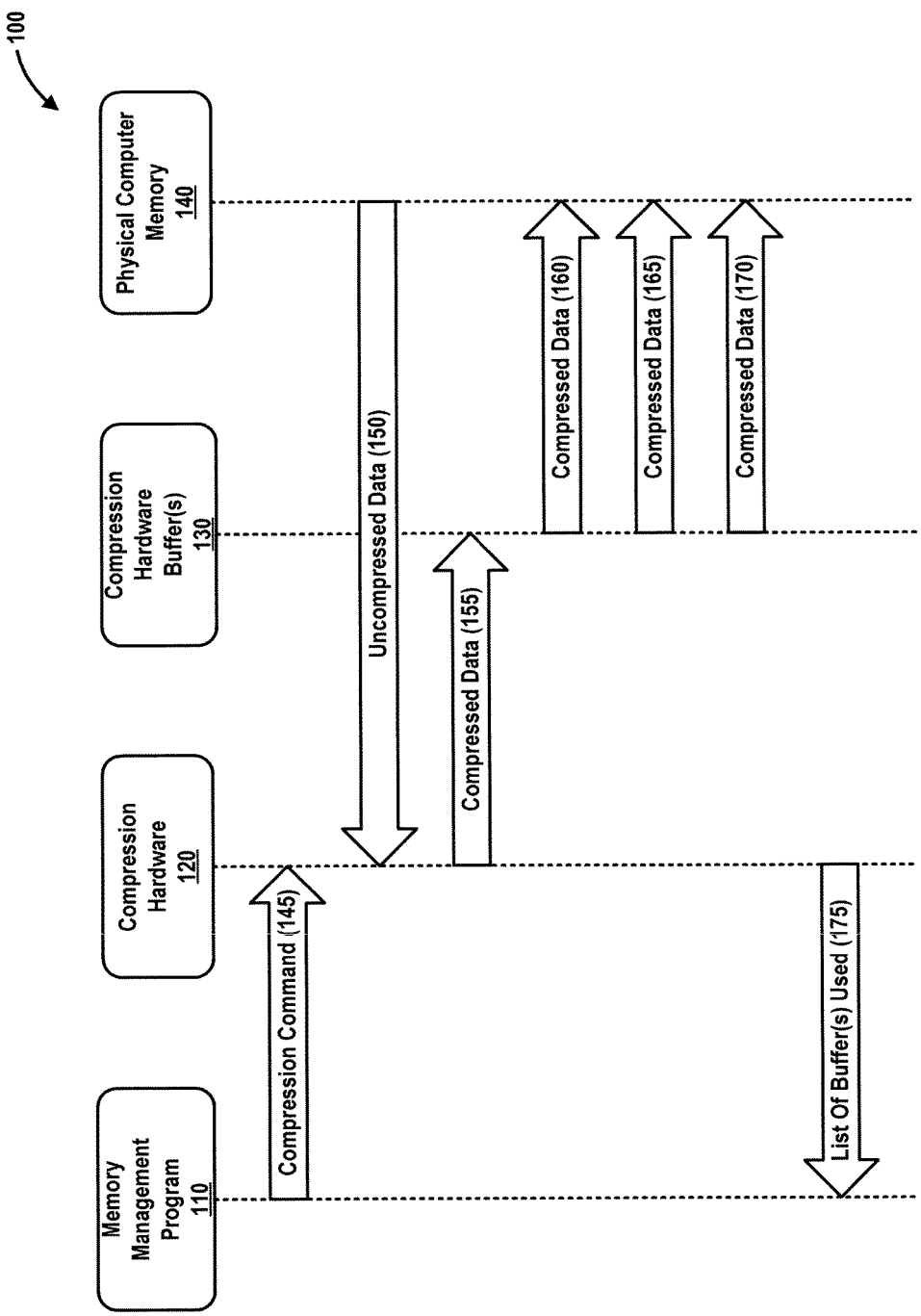
FIG. 1 is a data flow diagram illustrating example data flows in a system for managing fragmentation for hardware-assisted compression of data in physical computer memory according to one or more embodiments.

The headings provided herein are for convenience only and do not necessarily affect the scope or meaning of what is claimed in the present disclosure.

In the drawings, the same reference numerals and any acronyms identify elements or acts with the same or similar structure or functionality for ease of understanding and convenience. The drawings will be described in detail in the course of the following Detailed Description.

DETAILED DESCRIPTION

Various examples and embodiments of the methods, devices, and systems of the present disclosure will now be described. The following description provides specific details for a thorough understanding and enabling description of these examples. One skilled in the relevant art will understand, however, that one or more embodiments described herein may be practiced without many of these details. Likewise, one skilled in the relevant art will also understand that one or more embodiments of the present disclosure can include other features not described in detail herein. Additionally, some well-known structures or functions may not be shown or described in detail below to avoid unnecessarily obscuring the relevant description.

Many existing approaches for compression of data in physical computer memory are based entirely on software. While some existing approaches are hardware-based, such approaches are often simplistic and try to avoid the fragmentation problem by using a fixed ratio (e.g., half of the page size) for a size of one or more available buffers in which to store the compressed data. This significantly limits the amount of space gained from compression of data in physical computer memory if after storage there is a great deal of unused space that results when the compressed data does not fill the fixed amount of space allocated to the buffer. As used herein, space refers to memory storage capacity, which for example may be measured in bytes. Unused space is available for storage and used space contains stored data.

Embodiments of the present disclosure relate to methods, devices, and systems for managing fragmentation for hardware-assisted compression of data in physical computer memory. As will be described in greater detail below, the methods, devices, and systems of the present disclosure provide a way for compression hardware and a memory management program to work together to minimize memory fragmentation, minimize hardware complexity, and allow the compression hardware to operate with reduced involvement by the memory management program.

Figure 5:
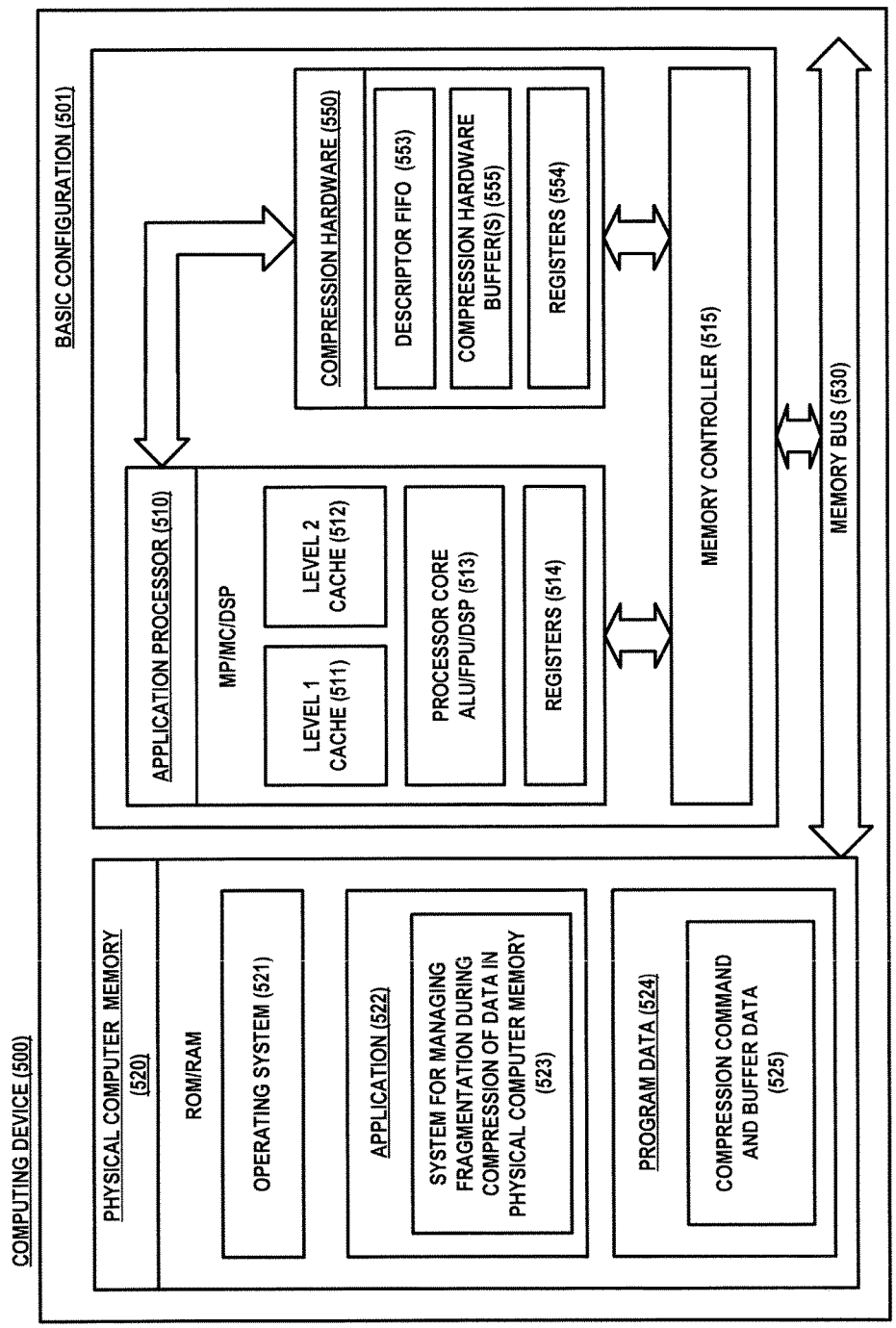
FIG. 5 is a block diagram illustrating an example computing device arranged for managing fragmentation in hardware-assisted compression of data in physical computer memory according to one or more embodiments.

As described above, it is difficult to know ahead of time whether a particular piece (e.g., portion, amount, etc.) of data in physical computer memory can be compressed and, if so, to what extent that data can be compressed. However, at some point before compression is complete, a decision must be made about how much space will be occupied by the particular piece of compressed data. In accordance with one or more embodiments of the present disclosure, compression hardware (which sometimes may be referred to as "a memory compression offload engine" or simply "engine" or "hardware" for the sake of brevity) is provided, whereby the compression hardware is designed to be extremely fast and efficient because of, among other features, having limited interactions with a corresponding memory management program. A memory management program may be in the form of software or firmware, and may be a module of an operating system. FIG. 5 and related disclosure include additional details regarding implementation of the compression hardware in an example embodiment.

A simplified example for hardware-assisted compression of data in physical computer memory may be as follows: (i) a memory management program instructs compression hardware to compress data in an address in physical computer memory; (ii) the compression hardware compresses the data and informs the memory management program about the size of the compressed data; (iii) the memory management program, based on the information about the size of the compressed data, decides on a location (e.g., in physical computer memory) to store the compressed data; and (iv) the memory management program instructs the compression hardware to store the compressed data in the decided location. From this example, it is easy to see that under such existing approaches the communication overhead, and associated latency, becomes quite expensive given the numerous interactions between the memory management program and compression hardware.

Allowing compression hardware to make more decisions will provide a faster interface. The difficulty comes from the fact that it is not compression hardware that is managing all physical computer memory in the system. Therefore, in accordance with one or more embodiments of the present disclosure, the compression hardware may be given a few choices and allowed to select a set of one or more optimal, or nearly optimal, buffers out of the choices provided. In accordance with one or more embodiments described herein, the compression hardware may determine that the optimal, or nearly optimal, selection involves multiple buffers. For example, to get the compressed data to fit while also minimizing, or nearly minimizing, any lost/wasted/unused space, the compression hardware may select more than one of the buffer choices made available (e.g., presented or provided) by the memory management program. For example, the compression hardware may determine that using a combination of smaller buffers is more favorable than using one large buffer, which may either not be large enough to accommodate the compressed data, or may be larger than necessary.

Once the compression hardware has selected (e.g., determined, chosen, decided, etc.) one or more of the available buffers, the compression hardware may then inform the memory management program about its selection. It should be noted that the compression hardware may inform the memory management program of the selected buffer(s)

either before the compression hardware compresses the buffers, or at a time after the compression is complete. That is, while the compression hardware may not know with certainty a size of the compressed data before compression, it may be able to estimate or infer a size of the compressed data before compression. The memory management program may request such information from the compression hardware before or after compression.

For example, in accordance with one or more embodiments, the methods, devices, and systems described herein are designed such that the memory management program uses compression hardware to compress fixed-size pieces of data in physical computer memory (e.g. pages) asynchronously, and attempts to minimize, or approximate a minimum of, fragmentation and achieve a favorable compression ratio, or effective compression ratio. The methods, devices, and systems of the present disclosure are designed such that the compression hardware can cause the compressed data to be moved into one or more new locations quickly and without any direct assistance from the memory management program. The compression hardware can thus move on to the next uncompressed data without any delay, thereby minimizing fragmentation while still maintaining a high speed of compression.

FIG. 1 shows example data flows in a system 100 for managing fragmentation for hardware-assisted compression of data in physical computer memory. In accordance with one or more embodiments described herein, the system may include memory management program 110 (e.g. software, firmware, or a portion of an operating system), compression hardware 120, one or more compression hardware buffers 130, and physical computer memory 140 (e.g., main memory or random access memory (RAM)). The compression hardware buffers 130 may be internal or external to the compression hardware, depending on preferences and design factors in implementation. In one or more other embodiments, the example system 100 may include other components in addition to or instead of the example components mentioned above. Similarly, the system 100 for managing fragmentation for hardware-assisted compression of data in physical computer memory 140 may include fewer components than the number of example components shown, or one or more of the example components shown may be combined, without departing from the operations, features, or functionalities of the system as described herein.

In accordance with at least one embodiment, memory management program 110 may provide one or more compression commands (145) to compression hardware 120 including an address in physical computer memory 140 of data to be compressed and a list of available buffers, possibly of different sizes, in physical computer memory 140. The compression hardware 120 receives the one or more compression commands (145) from the memory management program 110, receives (e.g., retrieves, or otherwise obtains), using the address in physical computer memory 140 of data to be compressed, the uncompressed data (150) (e.g., pages) from the physical computer memory 140, and compresses (155) the received or provided data into one or more compression hardware buffers 130. The compression hardware (120) then knows what the minimum possible buffer size is for the compressed data 155. As such, the compression hardware 120 examines the list of available buffers provided in the compression command (145) from the memory management program 110, selects one or more of these available buffers to store the compressed data (160, 165, 170), and informs 175 the memory management program 110 which of the buffer(s) were selected. The memory management program 110 then processes completions. The completions may be data written by the compression hardware 120 and read by the memory management program 110 to indicate a compression command 145 was completed including, for example, the final status (e.g., compressed and stored in buffer(s), copied to buffer(s), compressed but not copied to buffer(s), etc.), which buffer(s) were used (if any), final compressed size, and any other relevant information. After identifying the buffer(s) that were selected (175) by the compression hardware 120, the memory management program 110 may determine which of the buffer(s) remain unused. The unused buffer(s) can be used again by the memory management program 110 on subsequent compression commands 145 sent to the compression hardware 120.

The example process described above is different from other types of offload operations (e.g., networking or encryption) due to the nature of compression. Because the final compressed size of data in physical computer memory 140 is not known ahead of time, there is an extra decision point in the process, which the methods, devices, and systems of the present disclosure efficiently split between compression hardware 120 and the memory management program 110.

In accordance with one or more embodiments described herein, the memory management program 110 helps the corresponding compression hardware 120 make a more efficient decision by providing multiple buffers of different sizes and allowing the compression hardware 120 to split the contents of the compressed data 155 into multiple buffers. Among numerous other advantages, such an approach allows for more efficient packing of data, thereby reducing space lost due to fragmentation. The methods, devices, and systems of the present disclosure may achieve improved effective compression ratios due to less wasted space in the system, as well as simpler and faster hardware designs. Having the memory management program 110 be responsible for identifying available buffers (e.g., providing a list of free buffers) with the compression command 145 sent to the compression hardware 120 allows for reduced size and complexity of the compression hardware 120 since the compression hardware 120 does not need to manage potentially large pools of free buffers with different sizes, and also does not need to deal with eventual defragmentation issues.

As will be described in greater detail below, the present disclosure provides a method for compression hardware 120 to accelerate compression and decompression of data in physical computer memory 140. In accordance with at least one embodiment, compression hardware 120 is designed to operate on, for example, 4 kilobyte uncompressed pages. In the methods, devices, and systems provided herein, memory management program 110 may be responsible for managing allocation and fragmentation of physical computer memory 140.

In an example embodiment, a descriptor may contain a compression command 145 or a decompression command. A descriptor may be an element in a queue. A compression command 145 may include an address in physical computer memory 140 of data to be compressed, in addition to a list of available buffers in which to store compressed data 155. Similarly, a decompression command may include one or more addresses in physical computer memory 140 of data to be decompressed and a destination address in physical computer memory 140 in which to store the decompressed data.

In accordance with at least one embodiment of the present disclosure, memory management program 110 places commands into a descriptor first in, first out (FIFO) 200 queue. (See FIG. 2 and related discussion below.) Compression hardware 120 consumes compression commands 145 from the descriptor FIFO 200, processes them and writes the result back to the same descriptor. Compression hardware 120 can generate an interrupt upon completion of the descriptor based on, e.g., a value of a bit in a register. Upon receiving the interrupt, memory management program 110 can process the results from several descriptors and return the descriptor to the idle (e.g., "IDLE") state. Even though only one descriptor FIFO 200 queue may be provided, compression hardware 120 may have circuitry sufficient to process multiple compression commands 145 in parallel to achieve the desired bandwidth.

In accordance with at least one embodiment described herein, with each compression command 145 sent to compression hardware 120, memory management program 110 provides a number (e.g., four, six, eight, etc.) of available (e.g., target, free, etc.) buffers where the compressed data may be written. Each such available buffer may be, for example, a power-of-two size ranging from 64 bytes to 4 kilobytes, or some other range and/or variation of sizes.

The compression hardware 120 compresses the uncompressed data 150 into one or more compression hardware buffers 130 and determines how much space is needed to store the compressed data 155. Depending on the implementation, if the size of compressed data 155 is, for example, greater than 3 kilobytes, the uncompressed data 150 may be deemed incompressible and the uncompressed data 150 may optionally be copied to a 4 kilobyte destination buffer. Otherwise, compression hardware 120 selects one or more of the available buffers provided (e.g., identified, listed, etc.) by memory management program 110 that seeks to minimize, or approximate a minimum of, unused space, and the compressed data 155 is written to the selected buffers. For example, when two of the available buffers are selected by compression hardware 120, storage of the compressed data 155 may begin with the larger of the two buffers and may end in the smaller buffer. It is not necessary for the compression hardware 120 to overwrite the unused portion of the smaller buffer. Instead, the compression hardware 120 may indicate the size of the compressed data 155 and which of the available buffers were selected when the compression hardware 120 writes the result back to the descriptor.

Figure 1B:
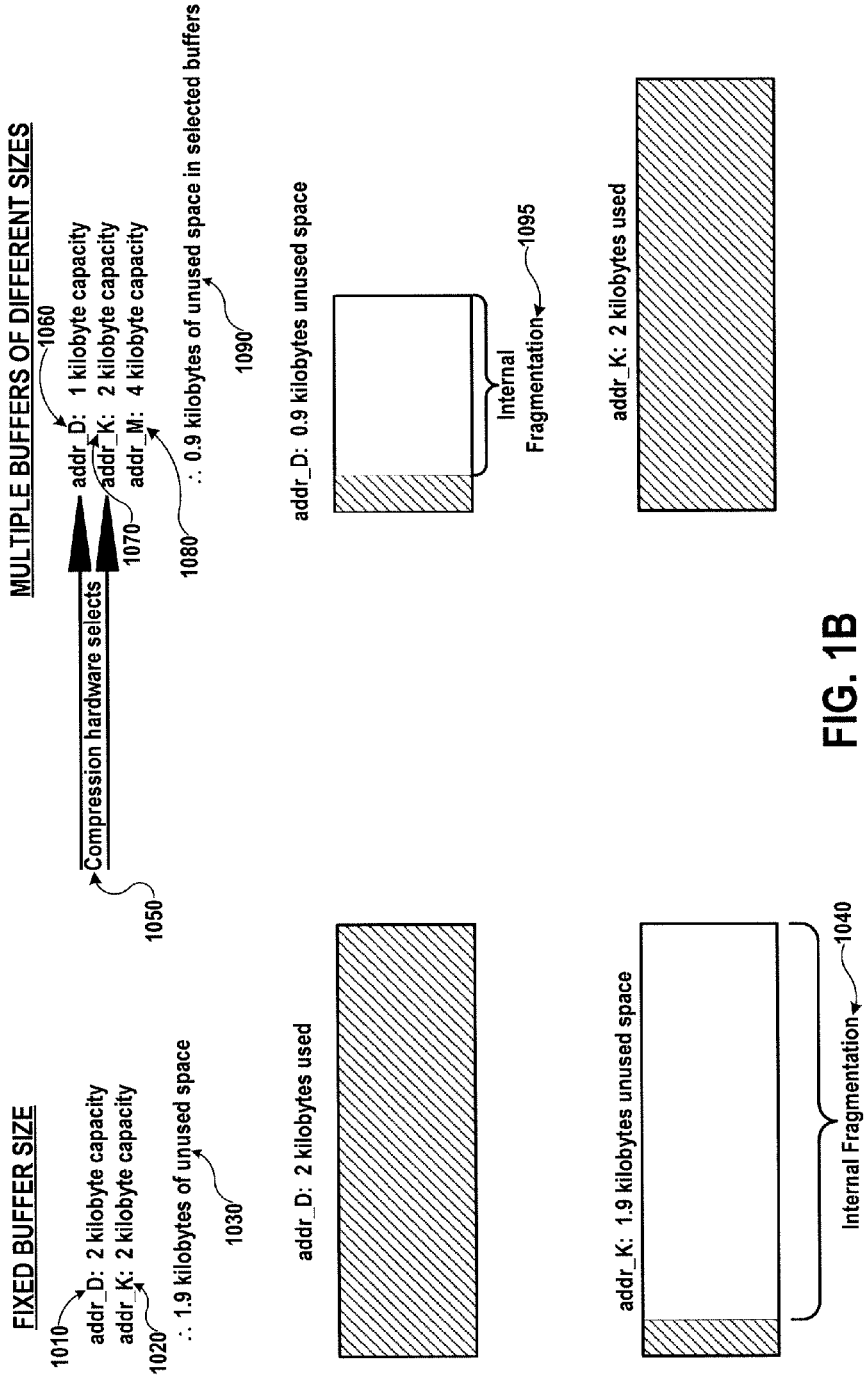
FIG. 1B is a diagram including a selection by compression hardware according to an example embodiment.

FIG. 1B is a diagram including a selection by compression hardware 120 according to an example embodiment. FIG. 1B illustrates two example scenarios, both where 8 kilobytes of uncompressed data 150 are compressed to 2.1 kilobytes of compressed data 155. In the first scenario, a list of two available buffers 1010 and 1020 are provided by a memory management program 110 to compression hardware 120. In this first scenario, buffers 1010 and 1020 are both 2 kilobytes. Compression hardware 120 will select both buffer 1010 and buffer 1020 to store the compressed data 155, splitting the compressed data 155 into two pieces, one 2 kilobyte piece stored in buffer 1010 and another 0.1 kilobyte piece stored in buffer 1020. Therefore, in this first scenario, there is 1.9 kilobytes of unused space 1030 remaining in buffer 1020. This unused space is an example of internal fragmentation 1040. In this first scenario, a ratio is 2.1 kilobytes of space used for compressed data 155 to 4 kilobytes of space in selected buffers.

In the second scenario, a list of three available buffers 1060, 1070, and 1080 are provided by a memory management program 110 to compression hardware 120. In this second scenario, buffers 1060, 1070, and 1080 are 1 kilobyte, 2 kilobytes, and 4 kilobytes, respectively. Compression hardware 120 will select 1050 both buffer 1060 and buffer 1070 to store the compressed data 155, splitting the compressed data 155 into two pieces, one 2 kilobyte piece stored in buffer 1070 and another 0.1 kilobyte piece stored in buffer 1060. Therefore, in this second scenario, there is 0.9 kilobytes of unused space 1090 remaining in buffer 1060. This unused space is an example of internal fragmentation 1095. In this second scenario, a ratio is 2.1 kilobytes of space used for compressed data 155 to 3 kilobytes of space in selected buffers.

The two scenarios in FIG. 1B are just two examples. In a scenario involving fixed buffer sizes where all available buffers provided by a memory management program 110 to compression hardware 120 have a same size, any selection of available buffers where the total capacity of the selected buffers exceeds a size of the compressed data 155 may suffice. However, in a scenario involving multiple available buffers of different sizes, compression hardware 120 may select from a list of available buffers based on an amount of space remaining in the available buffers after storing the compressed data 155. Therefore, in a scenario where a memory management program 110 provides to compression hardware 120 a list of multiple available buffers of different sizes, internal fragmentation may be reduced, and management of available space in physical computer memory 140 may be improved, relative to a scenario where a memory management program 110 provides to compression hardware 120 a list of available buffers all having a same size.

Figure 1C:
FIG. 1C is a diagram including a selection by compression hardware according to an example embodiment.
Figure 1C:
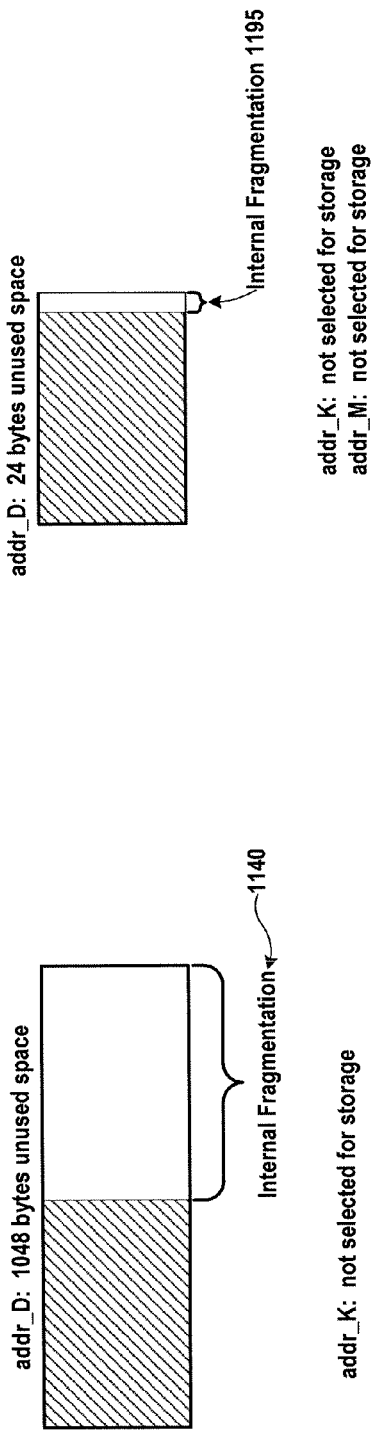

In at least one embodiment, it may be sufficient to select only one of the available buffers. FIG. 1C is a diagram including a selection by compression hardware 120 according to an example embodiment. FIG. 1C illustrates two example scenarios, both where 8 kilobytes of uncompressed data 150 are compressed to 1000 bytes of compressed data 155. In the first scenario, a list of two available buffers 1110 and 1120 are provided by a memory management program 110 to compression hardware 120. In this first scenario, buffers 1110 and 1120 are both 2 kilobytes. Compression hardware 120 need select only one buffer and can select buffer 1110 to store the compressed data 155 without the need to split the compressed data 155 into pieces. Therefore, in this first scenario, there is 1048 bytes of unused space remaining in buffer 1110. This unused space is an example of internal fragmentation 1140. In this first scenario, a ratio is 1000 bytes of space used for compressed data 155 to 2048 bytes of space in the selected buffer.

In the second scenario, a list of three available buffers 1160, 1170, and 1180 are provided by a memory management program 110 to compression hardware 120. In this second scenario, buffers 1160, 1170, and 1180 are 1 kilobyte, 2 kilobytes, and 4 kilobytes, respectively. Compression hardware 120 will select 1150 buffer 1160 to store the compressed data 155 and does not need to split the compressed data 155 into pieces. Therefore, in this second scenario, there are 24 bytes of unused space remaining in buffer 1160. This unused space is an example of internal fragmentation 1195. In this second scenario, a ratio is 1000 bytes of space used for compressed data 155 to 1024 bytes of space in the selected buffer.

The two scenarios in FIG. 1C are just two examples. In a scenario involving multiple available buffers of different sizes, compression hardware 120 may select from a list of available buffers based on an amount of space remaining in the available buffers after storing the compressed data 155. Therefore, in a scenario where a memory management program 110 provides to compression hardware 120 a list of multiple available buffers of different sizes, internal fragmentation may be reduced, and management of available space in physical computer memory 140 may be improved, relative to a scenario where a memory management program 110 provides to compression hardware 120 a list of available buffers all having a same size.

Figure 2:
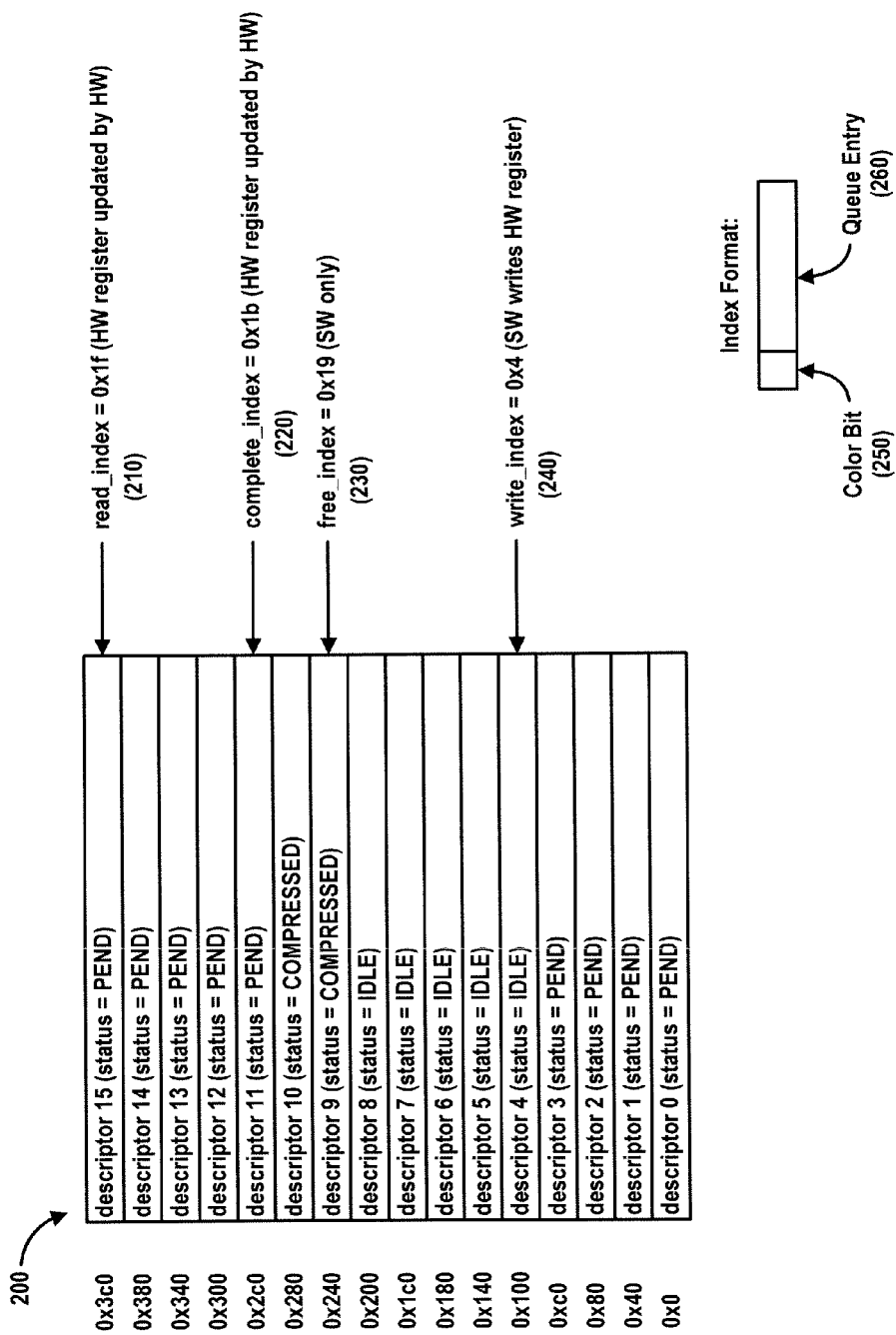
FIG. 2 is an example descriptor FIFO queue for communication between a memory management program and compression hardware during a compression operation according to one or more embodiments.

In accordance with one or more embodiments of the present disclosure, communication between memory management program 110 and compression hardware 120 during the compression operation may be done through a circular descriptor FIFO (first in, first out) 200 queue. The descriptor FIFO 200 may be in physical computer memory 140. FIG. 2 illustrates an example of such a circular descriptor FIFO 200. For example, memory management program 110 may set the size of, and a base register for, descriptor FIFO 200 at initialization, and the length of each queue element (e.g. including color bit 250 plus queue entry 260) may be, for example, 64 bytes. In at least one embodiment, a register containing the base address and size of descriptor FIFO 200 may be part of compression hardware 120. In accordance with at least one embodiment, memory management program 110 may program the following example command fields:

(i) Physical address to compress.

(ii) Some number (e.g., 6) of pointers to free areas and sizes. For example, the memory management program 110 may provide one buffer of each of the following sizes: 128 bytes, 256 bytes, 512 bytes, 1024 bytes, 2048 bytes, and 4096 bytes. In another example, a 64 byte buffer may also be provided. It should be understood, however, that the memory management program 110 may choose to provide any combination of buffer sizes, and that various other buffer sizes may be provided in addition to or instead of one or more of the example buffer sizes described above.

(iii) A bit to indicate whether an interrupt is required after the completion of this compression command 145.

In addition, the following example result fields may be set by compression hardware 120, in accordance with one or more embodiments described herein:

(i) Size of compressed data (e.g., in bytes).

(ii) Indication of which available buffers were used. For example, buf0_sel and buf1_sel may indicate a selection of the buffers used.

The status field within the descriptor FIFO 200 may be written by both compression hardware 120 and memory management program 110. For example, the memory management program 110 may set the status field to PEND to transfer ownership of the descriptor to compression hardware 120. Compression hardware 120 may then set the status field to a completion code (e.g., COMPRESSED, COPIED, ABORTED, ERROR, ZERO, or the like) to transfer ownership of the descriptor back to the memory management program 110.

Compression Operation

In accordance with one or more embodiments described herein, the memory management program 110 may produce groups of compression commands 145 into the descriptor FIFO 200 and compression hardware 120 may consume them. A pair of registers referred to as read and write indices may track the state of the descriptor FIFO 200. Additional details about the write index (240) and the read index (210), as well as two other indices (referred to herein as the complete index (220) and the free index (230)) are provided below.

In at least one example, the write index (240) is owned by (e.g., exclusively used by, associated with, etc.) the memory management program 110, and is not written to by compression hardware 120. The write index (240) is initialized to zero and points to the next entry that the memory management program 110 will write. The memory management program 110 increments the write index (240) after inserting a compression command 145 into the descriptor FIFO 200 and writing the descriptor status to "PEND". The memory management program 110 may increment the write index (240) for multiple compression commands 145 with a single write to the write index register. The most significant bit (MSB) of the write index (240) is called the write color bit (250). The color bit (250) is not used to index into the descriptor FIFO 200, but may be used to distinguish the FIFO empty case from the FIFO full case. The color bit (250) may be inverted each time the write index (240) wraps from the last entry back to the first entry.

In accordance with one or more embodiments described herein, the read index (210) is owned by (e.g., exclusively used by, associated with, etc.) compression hardware 120, and is not written to by memory management program 110. The read index (210) is initialized to zero and points to the next descriptor that the compression hardware 120 will read to process. Compression hardware 120 may increment the read index (210) after fetching a descriptor and checking that status==PEND. The read index (210) also includes a color bit (e.g., color bit (250)).

As with the read index (210), the complete index (220) is also owned by (e.g., exclusively used by, associated with, etc.) compression hardware 120, and is not written to by memory management program 110. The complete index (220) is initialized to zero and points to the next command that compression hardware 120 will complete. Compression hardware 120 may increment the complete index (220) after completing the command, and compression hardware 120 writes the result and status fields accordingly. The MSB of the complete index (220) is called the read color bit (e.g., color bit (250)). The read color bit is not used to index into the descriptor FIFO 200, but may be used to distinguish the FIFO empty case from the FIFO full case.

In accordance with one or more embodiments, the free index (230) is implemented only in the memory management program 110. The free index (230) is initialized to zero and points to the next descriptor that will be freed up by the memory management program 110. The memory management program 110 may increment the free index (230) when it processes the completion result of a compression command 145 and has prepared the descriptor entry to be reused.

It should be noted that, in accordance with at least one embodiment of the present disclosure, the descriptor FIFO 200 is empty when the write index (240) matches the complete index (220) for all bits including the color bit (250); the descriptor FIFO 200 is full when the write index (240) matches the complete index (220) for all bits except the color bit (250); and the number of valid entries in the descriptor FIFO 200 is the write index (240)—complete index (220).

The memory management program 110 may be configured to ensure that the descriptor FIFO 200 does not overflow, and the compression hardware 120 may be configured to ensure against underflow (consumption of an element from an empty queue) of the descriptor FIFO 200. In accordance with one or more embodiments, the memory management program 110 may not write to any descriptor owned by compression hardware 120 (e.g., descriptors owned by compression hardware 120 may have status==PEND); the compression hardware 120 may not write to any descriptor that the compression hardware 120 does not own; the memory management program 110 may not write to any field not owned by the memory management program 110; the compression hardware 120 may not read an entry that is beyond the write index (e.g., write index (240) in the example shown in FIG. 2) programmed by the memory management program 110; the memory management program 110 may infer the complete index (e.g., complete index (220)) instead of reading it from the compression hardware 120; and the inferred complete index may be initialized to zero and may be incremented whenever the descriptor FIFO 200 is not empty and the status of the descriptor at the inferred complete index is not PEND.

According to at least one embodiment, compression hardware 120 may write command completion to the result and status fields in FIFO order as compression commands 145 are completed. Due to, for example, bus limitations and/or performance concerns, the compression hardware 120 may write other parts of the descriptor but will preserve values read. The compression hardware 120 may also set undefined or reserved fields to zero. In addition, the compression hardware 120 may raise an interrupt when the complete index 220 reaches a specified value (e.g., interrupt completion index register) or when a certain compression command 145 completes (e.g., as specified by a field in the compression command 145). The memory management program 110 may read these results from the descriptor and update book-keeping for free memory areas.

Figure 3:
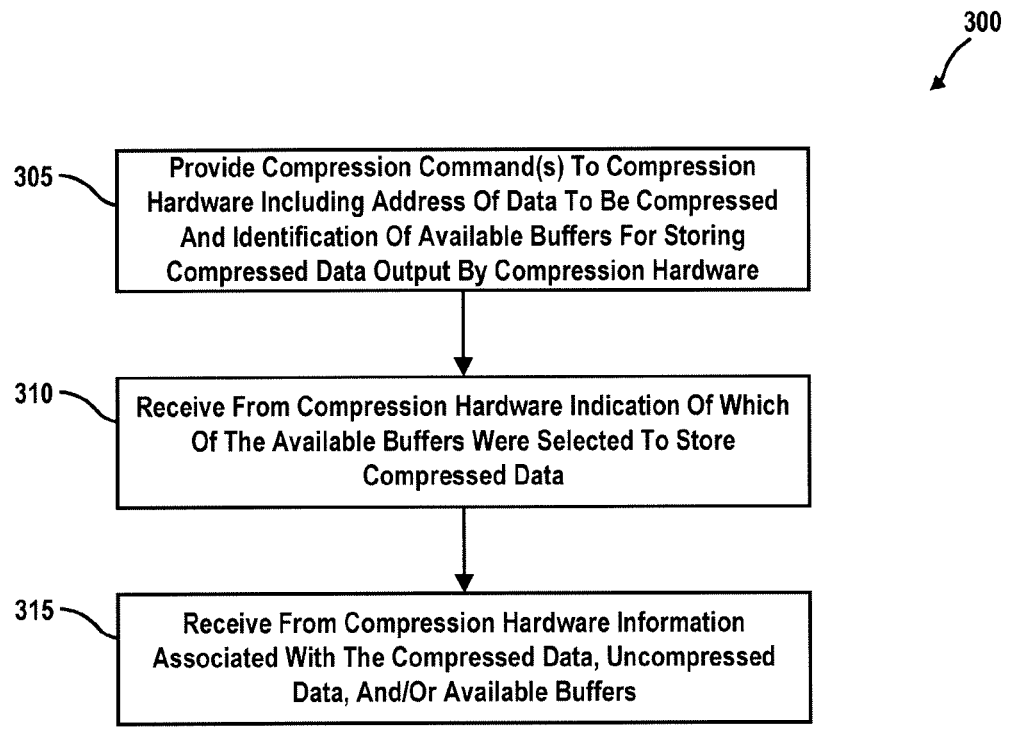
FIG. 3 is a flowchart illustrating an example process for managing fragmentation during compression of data in physical computer memory according to one or more embodiments.

FIG. 3 is an example process 300 for using memory management program 110 to manage fragmentation during compression of data in physical computer memory 140. In accordance with at least one embodiment, the example process 300 may include the operations set forth in blocks 305-315. It should be noted that, in accordance with one or more embodiments, the operations of example process 300 may be complementary to, and/or combined with, the operations of example process 400 (described in detail below and illustrated in FIG. 4).

At block 305, one or more compression commands 145 may be provided to compression hardware 120. For example, in accordance with at least one embodiment, the one or more compression commands 145 provided at block 305 may include an address in physical computer memory 140 of data to be compressed by the compression hardware 120 and an identification (e.g., a list) of available buffers in physical computer memory 140 for the compression hardware 120 to store compressed data 155 output by the compression hardware 120.

At block 310, an indication (e.g., communication, notification, etc.) may be received at the memory management program 110 from the compression hardware 120, where the indication indicates which of the available buffers were selected by the compression hardware 120 to store compressed data 155.

At block 315, information may be received (e.g., at the memory management program 110) from the compression hardware 120, where the information is associated with the compressed data 155, uncompressed data 150, and/or the available buffers that were provided in the compression command 145 (e.g., at block 305). For example, the information associated with the uncompressed data 150, the compressed data 155, and/or the available buffers may include a size of the data compressed by the compression hardware 120, a status of the compressed data 155 (e.g., the compressed data was stored in the one or more buffers selected by the compression hardware 120, the compressed data 155 was copied to one or more buffers selected by the compression hardware 120, the compressed data 155 was not copied to the one or more buffers selected by the compression hardware 120, etc.), and/or a status of the uncompressed data 150 (e.g., the uncompressed data 150 is incompressible, the uncompressed data 150 was copied to a destination buffer, etc.).

It should be noted that in accordance with at least one embodiment described herein, the information received from the compression hardware 120 at block 315 may be received (e.g., at the memory management program 110) together with the indication of selected buffers at block 310.

Figure 4:
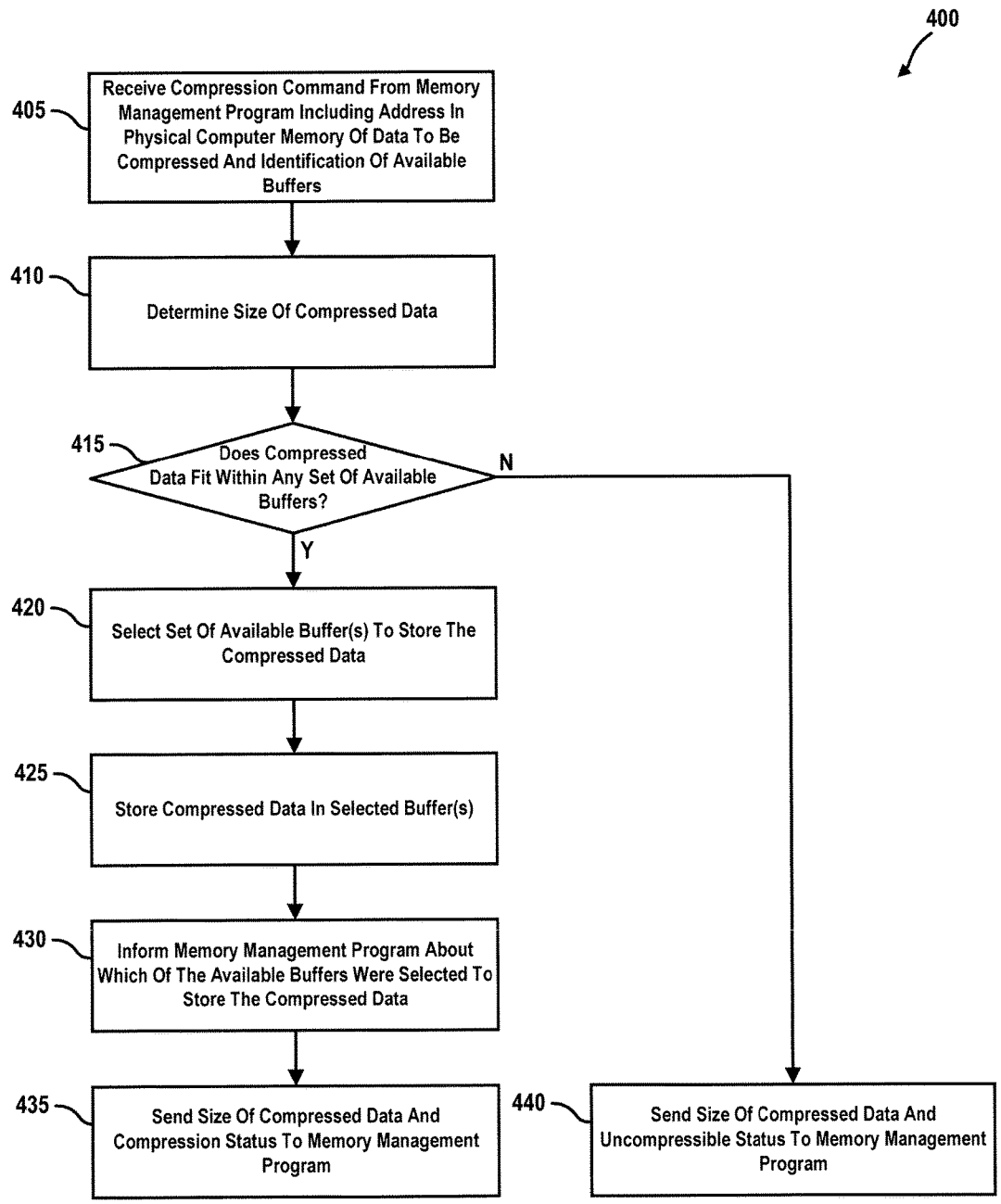
FIG. 4 is a flowchart illustrating an example process for hardware-assisted compression of data in physical computer memory according to one or more embodiments.

FIG. 4 is an example process 400 for hardware-assisted compression of data in physical computer memory 140. For example, in accordance with at least one embodiment described herein, the example process 400 may be performed by compression hardware 120, and may include the operations of blocks 405-440. First, the compression hardware 120 may receive (405) a compression command 145 from a memory management program 110 including an address of a buffer to be compressed and data identifying available buffers of different sizes. Second, the compression hardware 120 may determine (410) a minimum possible buffer size for storing data to be compressed. If determined in (415) the compressed data 155 will not fit within any set of the available buffers, the compression hardware 120 may send (440) the compressed size of the data and an uncompressible status to the memory management program 110. If determined in (415) the compressed data 155 will fit within any set (where a set may comprise one or more than one) of the available buffers, the compression hardware 120 may select (420) a set (where a set may comprise one or more than one) of the available buffers to store the compressed data 155. Then, the compression hardware 120 may compress data and store (425) the compressed data 155 in the selected buffer(s). Next, the compression hardware 120 may inform (430) the memory management program 110 about which of the available buffers were selected to store the compressed data 155. The compression hardware 120 may then send (435) the compressed size of data and a compression status to the memory management program 110.

In at least one embodiment, by utilizing multiple buffers, benefit may be gained even with respect to data that was deemed incompressible. For example, in accordance with at least one embodiment, after the compression hardware 120 has determined to what extent, if any, a given piece (e.g., set, block, etc.) of data compresses, the compression hardware 120 may still be used to split up the data. For example, in a scenario where 4 kilobyte pieces are being used, the data may be split into smaller buffers, which, depending on the memory scheme implemented by the operating system, may improve external fragmentation.

Decompression Operation

In accordance with one or more embodiments, the methods, devices, and systems of the present disclosure may include various decompression operations. There may be multiple sets of decompression command registers, and each set of command registers may be statically allocated to a memory management program 110 for a specific purpose. For example, each CPU may have a dedicated set of command registers to service decompression for a page fault handler.

In an example embodiment, the memory management program 110 may program the decompress command registers, and the final write sets the status field in a decompress destination register to PEND.

In an example embodiment, compression hardware 120 may process the decompress command by performing a decompression operation. Compression hardware 120 may then update the status field in the decompress destination register to a completion code (e.g., DECOMPRESSED or ERROR). Optionally, compression hardware 120 may write the completion code to a specified location in physical computer memory 140. Further, compression hardware 120 may optionally generate an interrupt once the decompression operation has been executed.

In an example embodiment, the decompression command may include a field where the memory management program 110 may indicate the size of the compressed data 155 (if it is available). This field is optional and, if not available, compression hardware 120 will need to be able to automatically determine the end of the compressed data 155 and ignore the remaining portion of the buffer that may not have been written during compression.

In an example embodiment, depending on implementation, the memory management program 110 may poll the decompress destination register, poll the specified location in physical computer memory 140, and/or wait for the interrupt to detect completion.

It should be understood that, in accordance with one or more embodiments of the present disclosure, a decompression operation may be capable of handling multiple buffers containing the compressed data 155. That is, where uncompressed data 150 was split and stored in more than one location (e.g., 160, 165) after compression, the decompression operation of the split compressed data (e.g., 160, 165) will need to load data from the more than one location to decompress the requested data.

Further, in an example embodiment, the decompression operation may have a control for interrupt. That is, if the implementation includes an interrupt generated once the decompression operation is completed, a control for an interrupt may be included in the implementation. The control for interrupt may be in the form of a bit in the decompress command register.

Further, in an example embodiment, the decompression operation may have a control for a result write. That is, should the implementation include the option of writing the status to the specified memory location upon command completion, compression hardware 120 may write the result to a location in physical computer memory 140 specified by a decompress command result write address.

Figure 6:
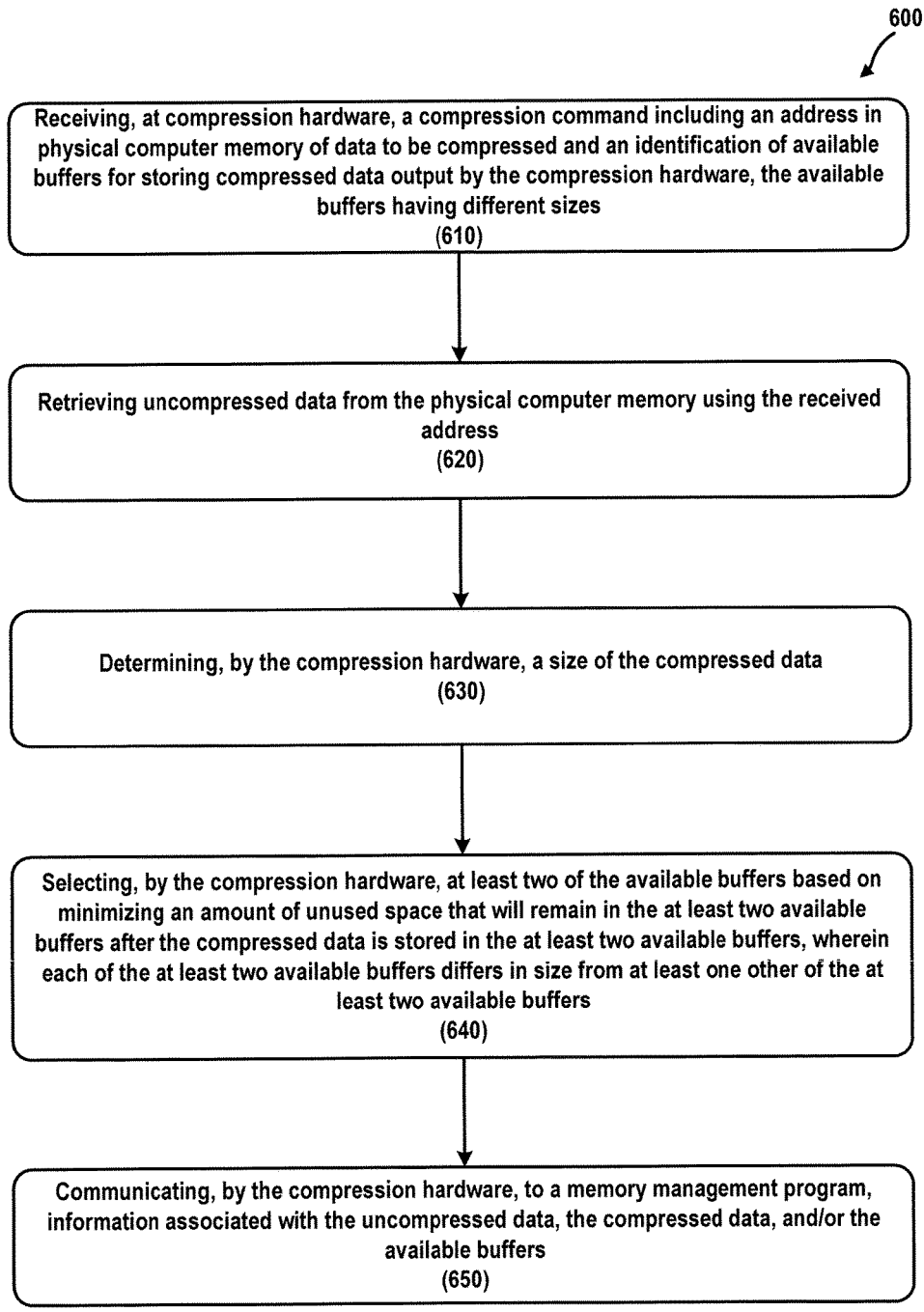
FIG. 6 is a flow diagram for a computer-implemented method related to a compression command received by compression hardware according to an example embodiment.

FIG. 6 is a flow diagram for a computer-implemented method (600) related to a compression command 145 received by compression hardware 120 according to an example embodiment. First, a compression command 145 including an address in physical computer memory 140 of data to be compressed and an identification of available buffers for storing compressed data 155 output by the compression hardware 120 is received (610) at compression hardware 120, the available buffers having different sizes. Second, uncompressed data 150 is retrieved (620) from the physical computer memory 140 using the received address. Third, a size of the compressed data 155 is determined (630) by the compression hardware 120. Fourth, at least two of the available buffers are selected (640) by the compression hardware 120 based on minimizing an amount of unused space that will remain in the at least two available buffers after the compressed data 155 is stored in the at least two available buffers, wherein each of the at least two available buffers differs in size from at least one other of the at least two available buffers. Fifth, information associated with the uncompressed data 150, the compressed data 155, and/or the available buffers is communicated (650) by the compression hardware 120 to a memory management program 110.

In at least one embodiment, as illustrated involving example data in FIG. 1C, it may be sufficient that only one of the available buffers is selected by the compression hardware 120.

Figure 9:
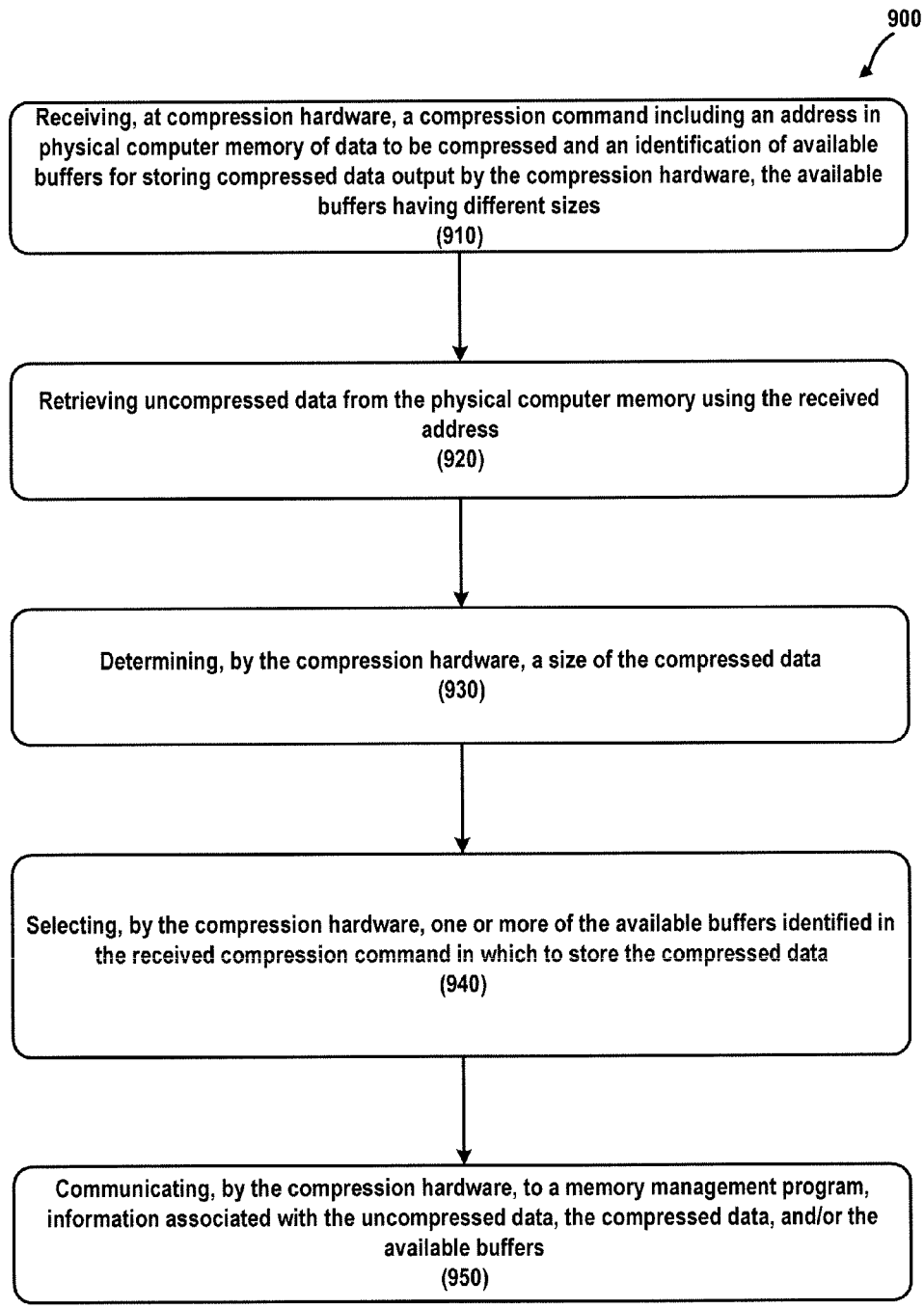
FIG. 9 is a flow diagram for a computer-implemented method related to a compression command received by compression hardware according to an example embodiment.

FIG. 9 is a flow diagram for a computer-implemented method 900 related to a compression command 145 received by compression hardware 120 according to an example embodiment. First, a compression command 145 including an address in physical computer memory 140 of data to be compressed and an identification of available buffers for storing compressed data 155 output by the compression hardware 120 is received (910) at compression hardware 120, the available buffers having different sizes. Second, uncompressed data 150 is retrieved (920) from the physical computer memory 140 using the received address. Third, a size of the compressed data 155 is determined (930) by the compression hardware 120. Fourth, one or more of the available buffers identified in the received compression command 145 in which to store the compressed data 155 are selected (940) by the compression hardware 120. Fifth, information associated with the uncompressed data 150, the compressed data 155, and/or the available buffers is communicated (950) by the compression hardware 120 to a memory management program 110.

Figure 7:
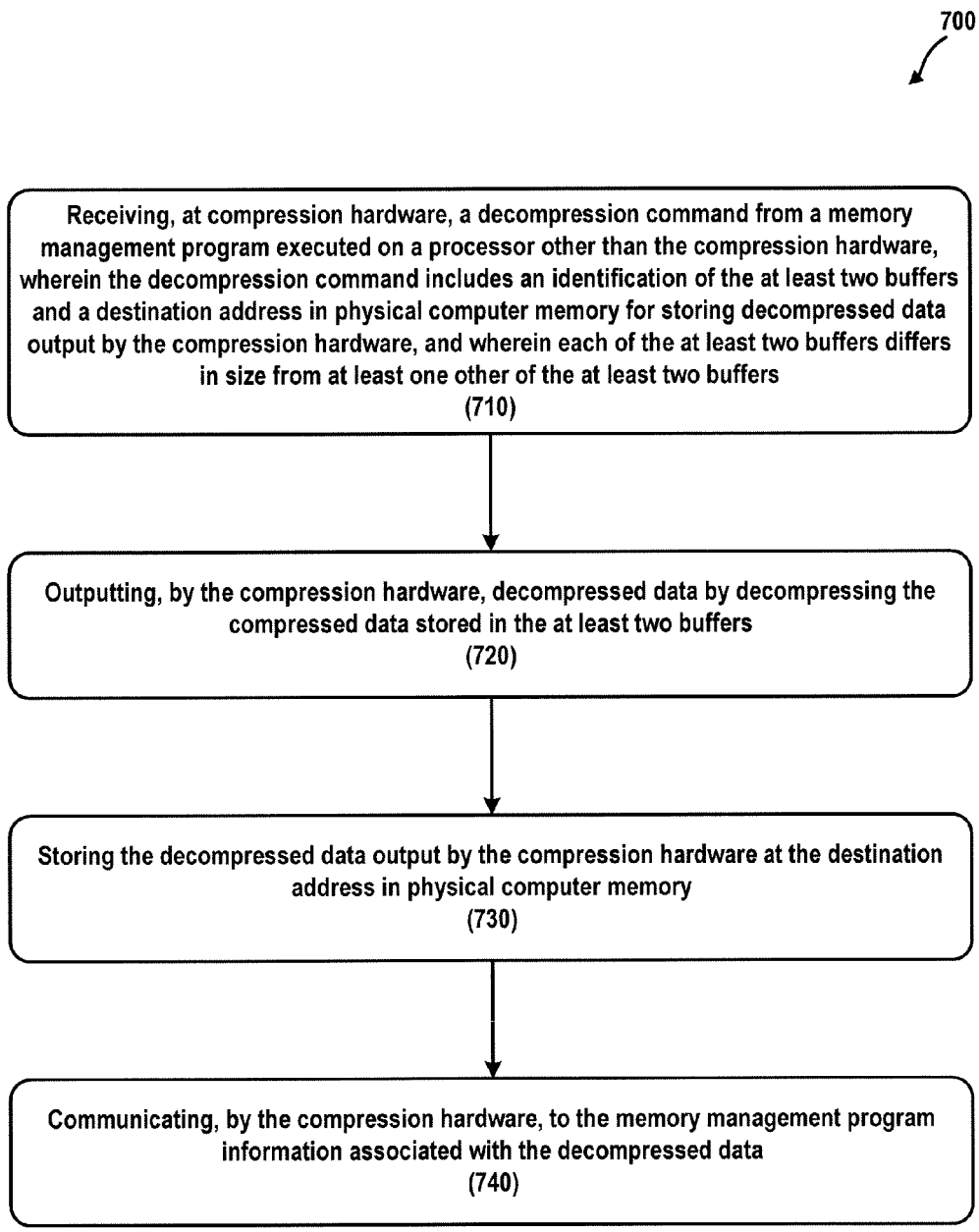
FIG. 7 is a flow diagram for a computer-implemented method for decompressing compressed data stored in at least two buffers in physical computer memory according to an example embodiment.

FIG. 7 is a flow diagram for a computer-implemented method (700) for decompressing compressed data 155 stored in at least two buffers in physical computer memory 140 according to an example embodiment. First, a decompression command from a memory management program 110 executed on a processor other than compression hardware 120 is received (710) at the compression hardware 120, wherein the decompression command includes an identification of the at least two buffers and a destination address in physical computer memory 140 for storing decompressed data output by the compression hardware 120, and wherein each of the at least two buffers differs in size from at least one other of the at least two buffers. Second, decompressed data is output (720) by the compression hardware 120 by decompressing the compressed data (at least 160, 165) stored in the at least two buffers. Third, the decompressed data output by the compression hardware 120 is stored (730) at the destination address in physical computer memory 140. Fourth, information associated with the decompressed data is communicated (740) by the compression hardware 120 to the memory management program 110.

Figure 8:
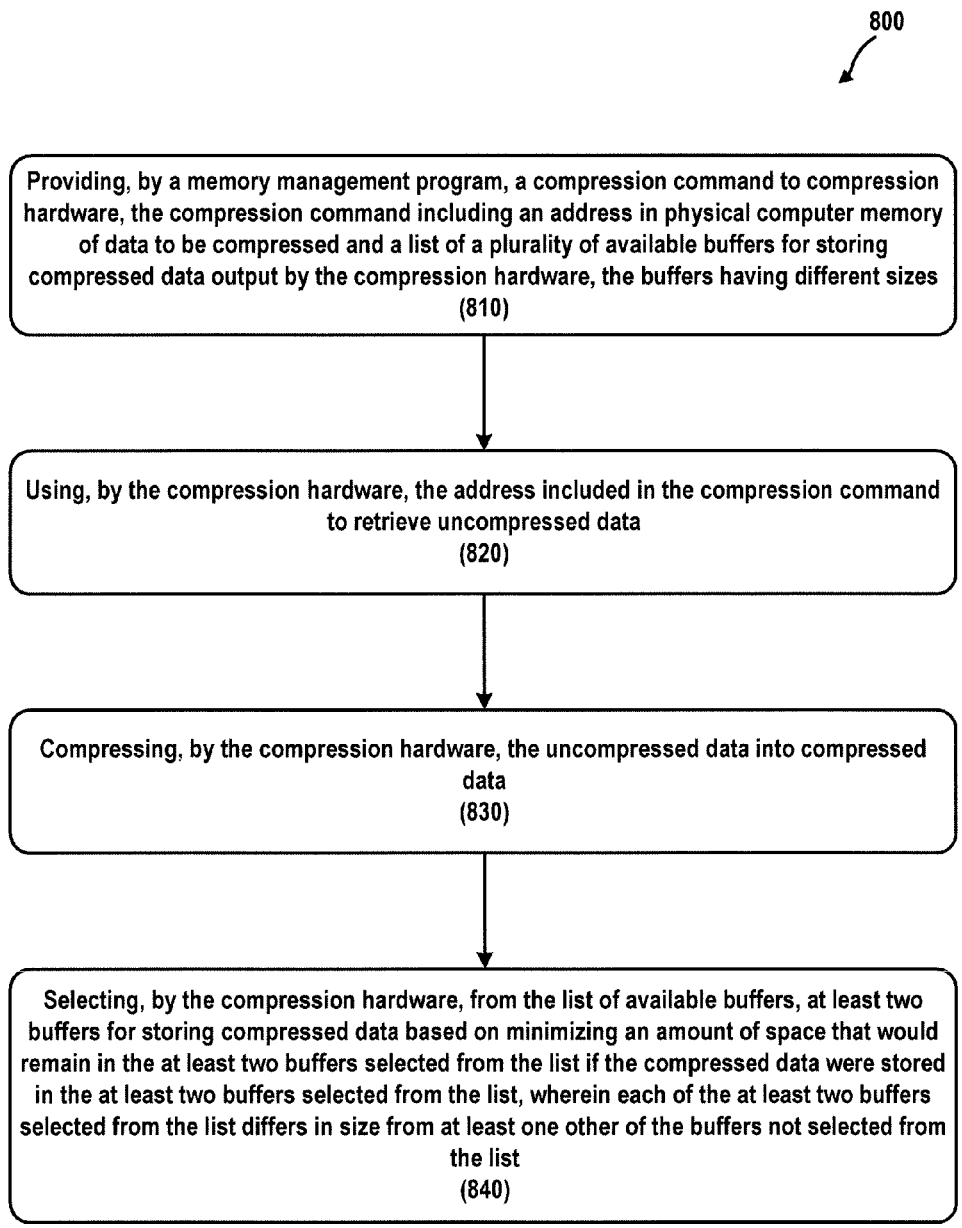
FIG. 8 is a flow diagram for a computer-implemented method related to a compression command received by compression hardware according to an example embodiment.

FIG. 8 is a flow diagram for a computer-implemented method (800) related to a compression command 145 received by compression hardware 120 according to an example embodiment. First, a memory management program 110 provides (810) a compression command 145 to compression hardware 120, the compression command 145 including an address in physical computer memory 140 of data to be compressed and a list of a plurality of available buffers for storing compressed data 155 output by the compression hardware 120, the buffers having different sizes. Second, the compression hardware 120 uses (820) the address included in the compression command 145 to retrieve uncompressed data 150. Third, the compression hardware 120 compresses (830) the uncompressed data 150 into compressed data 155. Fourth, the compression hardware 120 selects (840), from the list of available buffers, at least two buffers for storing compressed data 155 based on minimizing an amount of unused space that will remain in the at least two buffers selected from the list after the compressed data 155 is stored in the at least two buffers selected from the list, wherein each of the at least two buffers selected from the list differs in size from at least one other of the buffers not selected from the list.

FIG. 5 is a high-level block diagram of an exemplary computing device (500) that is arranged for managing fragmentation for hardware-assisted compression of data in physical computer memory (520, 140) in accordance with one or more embodiments described herein. For example, in accordance with at least one embodiment of the present disclosure, the computing device (500) may be configured to provide a way for compression hardware 120 and memory management program 110 to work together to minimize fragmentation in physical computer memory (520, 140), minimize complexity of compression hardware 120, and allow the compression hardware 120 to operate continuously without excessive intervention from the memory management program 110 for free space management.

In a very basic configuration (501), the computing device (500) typically includes one or more processors (510), physical computer memory (520, 140) (e.g., system memory) and compression hardware (550, 120). A memory bus (530) can be used for communicating between the processor(s) (510), compression hardware (550, 120) and the physical computer memory (520, 140).

Depending on the desired configuration, the processor(s) (510) can be of any type including but not limited to a microprocessor (µP), a microcontroller (µC), a digital signal processor (DSP), or the like, or any combination thereof. In accordance with at least one embodiment, application processor (510) may be programmed according to the methods described above in connection with memory management program 110 including pertinent portions of the methods outlined in FIGS. 3, 4, 6, 7, 8, and 9. Compression hardware (550, 120) may be constructed with an application-specific integrated circuit (ASIC), custom integrated circuit, digital signal processor (DSP), field programmable gate array (FPGA), or other dedicated hardware implementation. Compression hardware (550, 120) may be hardware in the form of dedicated integrated circuitry designed for a data compression method and, optionally, a data decompression method. In an example embodiment, the dedicated compression hardware (550, 120) may continuously consume available descriptors to perform compression of data in physical computer memory (520, 140) for free space management without intervention from the memory management program 110 running on the application processor (510).

Processor(s) (510) can include one more levels of caching, such as a level one cache (511) and a level two cache (512), a processor core (513). Registers (514, 554) may also be provided for the application processor 510 and the compression hardware 550. The processor core (513) can include an arithmetic logic unit (ALU), a floating-point unit (FPU), a digital signal processing core (DSP Core), or the like, or any combination thereof.

A memory controller (515) can also be used with the one or more processors (510, 550), or in some implementations separate memory controllers (515) can be an internal part of each of the one or more processors (510, 550). In another embodiment, the compression hardware (550, 120) may, like the processor 510, be a master of the memory controller 515. In an example embodiment, the connection between the compression hardware (550, 120) and the memory controller 515 may be direct. In another example embodiment, the connection between the compression hardware (550, 120) and the memory controller 515 may be indirect, e.g., via an interconnect. In an example embodiment, the compression hardware (550, 120) may be in electronic communication with the application processor 510. In an example embodiment, the compression hardware (550, 120) may include descriptor FIFO (553, 200) and compression hardware buffer(s) (555, 130).

Depending on the desired configuration, the physical computer memory (520, 140) can be of any type including but not limited to volatile memory (such as RAM), non-volatile memory (such as ROM, flash memory, etc.) or any combination thereof. Physical computer memory (520, 140) typically includes an operating system (521), one or more applications (522), and program data (524). The application (522) may include a system for managing fragmentation for hardware-assisted compression of physical computer memory (523) as described herein.

In accordance with at least one embodiment of the present disclosure, the system for managing fragmentation for hardware-assisted compression of data in physical computer memory (523) is designed such that the memory management program 110 helps the corresponding compression hardware 120 make a more efficient decision by providing multiple buffers of different sizes and allowing the compression hardware 120 to either (a) split up the contents of the compressed data 155 into multiple buffers and select buffers to store the compressed data 155 based on the size of the compressed data 155 or (b) select a buffer to store the compressed data 155 based on the size of the compressed data 155, leading to more efficient packing of data and thereby reducing space lost due to fragmentation. The system for managing fragmentation for hardware-assisted compression of data in physical computer memory (523) can achieve improved effective compression ratios due to less wasted space in the system, as well as simpler and faster hardware designs.

Program Data (524) may include storing instructions that, when executed by the one or more processing devices, implement a system (523) and method for managing fragmentation for hardware-assisted compression of data in physical computer memory (520, 140). Additionally, in accordance with at least one embodiment, program data (524) may include compression command 145 and buffer data (525), which may relate to, for example, an address of data to be compressed and a list of free buffers of different sizes, from which associated compression hardware 120 may select for storing compressed data 155. In accordance with at least one embodiment, the application (522) can be arranged to operate with program data (524) on an operating system (521).

The computing device (500) can have additional features or functionality, and additional interfaces to facilitate communications between the basic configuration (501) and any required devices and interfaces.

Physical computer memory (520, 140) is an example of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 500. Any such computer storage media can be part of the device (500).

The computing device (500) may be implemented in an integrated circuit, such as a microcontroller or a system on a chip (SoC), or it may be implemented as a portion of a small-form factor portable (or mobile) electronic device such as a cell phone, a smartphone, a personal data assistant (PDA), a personal media player device, a tablet computer (tablet), a wireless web-watch device, a personal headset device, an application-specific device, or a hybrid device that includes any of the above functions. In addition, the computing device (500) may also be implemented as a personal computer including both laptop computer and non-laptop computer configurations, one or more servers, Internet of Things systems, and the like.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In accordance with at least one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers, as one or more programs running on one or more processors, as firmware, or as virtually any combination thereof, and that designing the circuitry and/or writing the code for the software and or firmware would be well within the skill of one of skill in the art in light of this disclosure.

In addition, those skilled in the art will appreciate that the mechanisms, or portions thereof, of the subject matter described herein are capable of being distributed as a program product in a variety of forms, and that an illustrative embodiment of the subject matter described herein applies regardless of the type of non-transitory computer-readable medium used to carry out the distribution. Examples of a non-transitory medium include, but are not limited to, the following: a recordable type medium such as a floppy disk, a hard disk drive, a solid state drive, a Compact Disc (CD), a Digital Video Disk (DVD), a digital tape, a computer memory, etc.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The systems, devices, and methods discussed herein do not require collection or usage of user personal information. In situations in which certain implementations may collect or use personal information about users (e.g., user data, information about a user's social network, user's location and time, user's biometric information, user's activities, and demographic information), users are provided with one or more opportunities to control whether the personal information is collected, whether the personal information is stored, whether the personal information is used, and how the information is collected about the user, stored, and used. That is, the systems, devices, and methods discussed herein collect, store, and/or use user personal information specifically upon receiving explicit authorization from the relevant users to do so. In addition, certain data may be treated in one or more ways before it is stored or used so that personally identifiable information is removed. As one example, a user's identity may be treated so that no personally identifiable information can be determined. As another example, a user's geographic location may be generalized to a larger region so that the user's particular location cannot be determined.

Thus, embodiments of the subject matter have been described. Other embodiments are within the scope of the following claims. In some cases, the actions recited in the claims can be performed in a different order and still achieve desirable results. In addition, the processes depicted in the accompanying figures may not necessarily require the order shown, or sequential order, to achieve desirable results. In certain implementations, multitasking and parallel processing may be advantageous.

The invention claimed is:

1. A computer-implemented method of compressing data, the method comprising:
    receiving, by compression hardware and from a memory management program that is separate from the compression hardware, a compression command including an address in physical computer memory of uncompressed data to be compressed into compressed data and an identification of available buffers having different sizes for storing the compressed data;
    retrieving, by the compression hardware and from the physical computer memory, the uncompressed data;
    determining, by the compression hardware, a size of the compressed data;
    selecting, by the compression hardware, at least one buffer of the available buffers in which to store the compressed data, the selecting based on an amount of unused space that will remain in the at least one selected buffer after the compressed data is stored therein; and
    communicating, by the compression hardware and to the memory management program, information associated with the at least one selected buffer.

2. The computer-implemented method of claim 1, further comprising:
    receiving, by the compression hardware and from the memory management program, a second compression command including a second address in the physical computer memory of second uncompressed data to be compressed into second compressed data and an identification of available second buffers having different sizes for storing the second compressed data;
    retrieving, by the compression hardware and from the physical computer memory, the second uncompressed data;
    determining, by the compression hardware, that the second uncompressed data cannot be compressed based on a threshold amount of compression;
    selecting, by the compression hardware and based on a size of the second uncompressed data, at least one second buffer of the available second buffers in which to store the second uncompressed data; and
    communicating, by the compression hardware and to the memory management program, second information associated with the at least one selected second buffer.

3. The computer-implemented method of claim 2, wherein the second information comprises an indication that the second uncompressed data was not compressible.

4. The computer-implemented method of claim 1, wherein the selecting is further based on reducing the amount of unused space.

5. The computer-implemented method of claim 1, wherein the information comprises identification of the at least one selected buffer.

6. The computer-implemented method of claim 1, further comprising compressing, by the compression hardware, the uncompressed data into the compressed data.

7. The computer-implemented method of claim 1, wherein the at least one selected buffer comprises a plurality of selected buffers.

8. The computer-implemented method of claim 7, wherein the plurality of selected buffers have different sizes.

9. The computer-implemented method of claim 1 further comprising storing, by the compression hardware, the compressed data into the at least one selected buffer.

10. The computer-implemented method of claim 9, wherein the information comprises an amount of unused space that remains in the at least one selected buffer after the compressed data is stored within the at least one selected buffer.

11. The computer-implemented method of claim 9, further comprising decompressing, by the compression hardware, the compressed data in the at least one selected buffer in response to a decompression command from the memory management program.

12. A computer-implemented method of decompressing data, the method comprising:
receiving, by compression hardware and from a memory management program that is separate from the compression hardware, a decompression command including a location of two or more buffers of different sizes that contain compressed data to be decompressed into decompressed data and a location in physical computer memory to store the decompressed data;
retrieving, by the compression hardware and from the two or more buffers, the compressed data;
decompressing, by the compression hardware, the compressed data into the decompressed data;
storing, by the compression hardware, the decompressed data in physical computer memory; and
communicating, by the compression hardware and to the memory management program, information associated with the decompressed data.

13. The computer-implemented method of claim 12, wherein the information associated with the decompressed data comprises an update to a decompression status in a register, an interrupt, or a writing of a decompression status to an address in the physical computer memory.

14. A device, comprising:
a processor;
physical computer memory;
compression hardware separate from, and in communication with, the processor; and
a memory management program executed on the processor that provides a compression command to the compression hardware, the compression command including an address in the physical computer memory of uncompressed data to be compressed into compressed data and a list of a plurality of available buffers having different sizes for storing the compressed data, responsive to receiving the compression command the compression hardware performing operations comprising:
retrieving, from the physical computer memory, the uncompressed data;
determining a size of the compressed data;
selecting at least one buffer of the available buffers in which to store the compressed data, the selecting based on an amount of unused space that will remain in the at least one selected buffer after the compressed data is stored therein; and
communicating information associated with the at least one selected buffer to the memory management program.

15. The device of claim 14, wherein the selecting is further based on reducing the amount of unused space.

16. The device of claim 14, wherein the operations further comprise compressing the uncompressed data into the compressed data.

17. The device of claim 14, wherein the operations further comprise storing the compressed data in the at least one selected buffer.

18. The device of claim 14, wherein the operations further comprise communicating to the memory management program the size of the compressed data or an indication of the at least one selected buffer.

19. The device of claim 14, wherein the memory management program further provides a decompression command to the compression hardware, the decompression command including a location of at least two buffers of different sizes containing second compressed data to be decompressed into decompressed data and a location in the physical computer memory to store the decompressed data, responsive to receiving the decompression command the compression hardware performing operations comprising:
retrieving, from the buffers, the second compressed data;
decompressing the second compressed data into the decompressed data;
storing the decompressed data in the physical computer memory; and
communicating, to the memory management program, information associated with the decompressed data.

20. The device of claim 19, wherein the operations further comprise communicating to the memory management program an update in decompression status or an interrupt responsive to the storing.

* * * * *